(12) United States Patent
Cruz

(10) Patent No.: US 10,175,733 B2
(45) Date of Patent: Jan. 8, 2019

(54) SYSTEMS AND METHODS FOR SUBSTRATES

(71) Applicant: Intersil Americas LLC, Milpitas, CA (US)

(72) Inventor: Randolph Cruz, Melbourne, FL (US)

(73) Assignee: INTERSIL AMERICAS LLC, Milpitas, CA (US)

( * ) Notice: Subject to any disclaimer, the term of this patent is extended or adjusted under 35 U.S.C. 154(b) by 346 days.

(21) Appl. No.: 15/045,598

(22) Filed: Feb. 17, 2016

(65) Prior Publication Data

US 2017/0020028 A1    Jan. 19, 2017

Related U.S. Application Data

(60) Provisional application No. 62/193,691, filed on Jul. 17, 2015, provisional application No. 62/218,693, filed on Sep. 15, 2015.

(51) Int. Cl.
| | |
|---|---|
| *H01L 23/495* | (2006.01) |
| *G06F 1/26* | (2006.01) |
| *H01L 23/498* | (2006.01) |
| *H01L 23/13* | (2006.01) |
| *H01L 21/48* | (2006.01) |
| *G06F 1/18* | (2006.01) |
| *H01L 23/31* | (2006.01) |
| *H02M 3/158* | (2006.01) |

(52) U.S. Cl.
CPC ............ *G06F 1/26* (2013.01); *G06F 1/183* (2013.01); *H01L 21/4846* (2013.01); *H01L 23/13* (2013.01); *H01L 23/3121* (2013.01); *H01L 23/49805* (2013.01); *H01L 23/49822* (2013.01); *H01L 23/49827* (2013.01); *H01L 23/49838* (2013.01); *H02M 3/158* (2013.01)

(58) Field of Classification Search
CPC ....... G06F 1/26; G06F 1/183; H01L 21/4846; H01L 23/13; H01L 23/3121; H01L 23/49805; H01L 23/49822; H01L 23/49827; H01L 23/49838; H02M 3/158
USPC ........................................................ 257/668
See application file for complete search history.

(56) References Cited

U.S. PATENT DOCUMENTS

| | | |
|---|---|---|
| 7,795,710 B2 | 9/2010 | Islam et al. |
| 8,551,820 B1 | 10/2013 | Foster et al. |
| 8,779,568 B2 | 7/2014 | Do et al. |
| 8,871,572 B2 | 10/2014 | Cruz et al. |

(Continued)

OTHER PUBLICATIONS

Sung Yeul Park, Printed Circuit Board Design, powerpoint presentation, Dept. of Electrical and Computer Eng, University of Connecticut, Sep. 24, 2014.

(Continued)

*Primary Examiner* — Tu-Tu V Ho
(74) *Attorney, Agent, or Firm* — Foley & Lardner LLP

(57) ABSTRACT

One embodiment is directed towards a molded insulator substrate. The molded insulator substrate includes a first insulator having a first surface and a second surface. A recess in said first surface of the first insulator is configured to facilitate venting of a second insulator over exposed regions of the first surface. A first conductive terminal is exposed through the first surface. A second conductive terminal is exposed through the second surface and electrically coupled to the first terminal.

20 Claims, 11 Drawing Sheets

(56) References Cited

U.S. PATENT DOCUMENTS

2008/0150159 A1* 6/2008 Aberin .................. H01L 21/563
257/778
2016/0300787 A1* 10/2016 Sung ................ H01L 23/49816

OTHER PUBLICATIONS

Tony Garramone, How to Build a Printed Circuit Board, Advanced Circuits Inc. Jan. 12, 2007.
Randolph Cruz, "Apparatuses and Methods for Encapsulated Devices", U.S. Appl. No. 15/045,630, filed Feb. 17, 2016, pp. 1-13.
Randolph Cruz, "Apparatuses and Methods for Encapsulated Devices", U.S. Appl. No. 15/045,630, filed Feb. 17, 2016, Drawings pp. 1-7.
Molded Interconnect Substrate, http://www.advanpack.com/MIS.html, 2 pages.
Molded interconnect device, https://en.wikipedia.orgfwiki/Molded_interconnect_device, 3 pages.
MacDermid Electronic Solutions, Molded Interconnect Devices, http://electronics.masdermid.com/cms/applications/molded-intersonnect-devices/index.shtml, 1 page.
QDOS, Molded Interconnect Substrate (MIS), http://www.qdos.com.my/portfolio.php, 10 pages.

* cited by examiner

SYSTEMS AND METHODS FOR SUBSTRATES

CROSS-REFERENCED TO RELATED APPLICATION

This application claims the benefit of provisional U.S. Patent Application Ser. No. 62/193,691 filed Jul. 17, 2015 and provisional U.S. Patent Application Ser. No. 62/218,693 filed Sep. 15, 2015, both of which are incorporated herein by reference in their entirety.

DESCRIPTION OF THE EMBODIMENTS

Figure 1A:
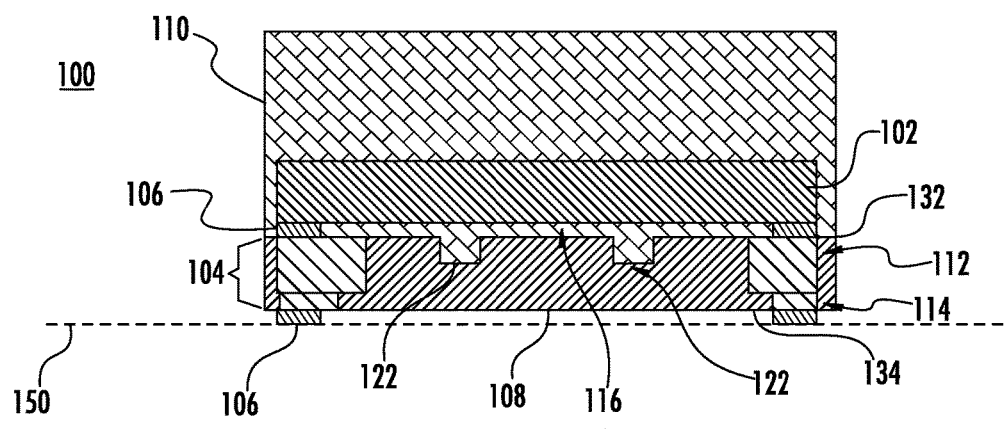
FIG. 1A is a cross-sectional view of an embodiment of an encapsulated component including a molded insulator carrier with recesses.

A molded interconnect substrate (MIS) is a carrier formed by a molded insulator, e.g. plastic, in which conductive, e.g. metal, terminal(s), and possibly conductive interconnect(s), i.e. electrically coupling such terminals, are formed. In one embodiment, the MIS may be used as a mechanical and electrical interface between one or more device(s) mounted on the MIS, and a mounting structure, e.g. a printed circuit board (PCB) upon which the MIS is mounted.

A device may be an active device, such as an integrated circuit (IC), a transistor, diode, or another active semiconductor device. A device may also be a passive device, such as inductor, capacitor, or a mechanical device such as an accelerometer. A device may have conductive terminals that are leaded or leadless. A device may be encapsulated (e.g. with a plastic such as a thermoset material, such as epoxy molding compound (EMC), or a thermoplastic material), or un-encapsulated. A component is formed when device(s) are mounted on an MIS.

In one embodiment, a first set of one or more terminals on a first side of the MIS may be attached to a second set of one or more terminals on the other side of the MIS. The first set of one or more terminal(s) may electrically couple one or more device(s) to the MIS. In another embodiment, the MIS may be mounted onto the mounting structure; a second set of one or more the terminals on a second side, e.g. opposite the first side, of the MIS may be attached to one or more terminal(s) on the mounting structure. Thus, the device(s) are electrically coupling to the mounting structure.

In a further embodiment, an encapsulated component is formed by encapsulating the component with an insulator (e.g. with a plastic such as a thermoset material, such as epoxy molding compound (EMC), or a thermoplastic material) in order to protect the component from the environment, and electrically isolate the component's MIS and device(s). The encapsulation is formed, e.g., by a molding process.

When mounting device(s) on an MIS, a gap is formed between the device(s) and MIS. The gap is relatively narrow compared to the dimensions of the items comprising the encapsulated component. It is difficult to vent and remove trapped air and volatile gases from molten encapsulation material (e.g. molten thermoset material, such as molten EMC, or a molten thermoplastic material) from a closed mold so that the molten material fills this gap. There is an increased risk of forming one or more void(s), i.e. pockets of gas and/or liquid, e.g. trapped-air, surrounded by encapsulation, in the gap during encapsulation. Such void(s) increase the thermal mechanical mismatch and corresponding interfacial stresses between the MIS and device. In addition, moisture could collect in the void(s); during subsequent thermal cycling, the hydrostatic pressure of the moisture could induce delamination at the juncture of the MIS and the encapsulation. The hydrostatic pressure may also cause cracks in the encapsulated component, e.g. in the encapsulation. Thus, such void(s) undesirably reduce encapsulated component reliability.

To reduce the risk of forming void(s) and to enhance reliability, one or more recesses can be formed in the molded insulator carrier on the side parallel to and closest to a side of the device. A molded insulator carrier is a carrier formed from molded insulator.

FIG. 1A illustrates one embodiment of the present invention, an encapsulated component 100 with two such recesses 122 formed in the molded insulator carrier 108. Recess(es) 122 facilitate the venting of the encapsulation 110 throughout the gap 116 (and over exposed regions of the molded insulator carrier 108 and device 102 which form the gap 116).

Figure 1B:
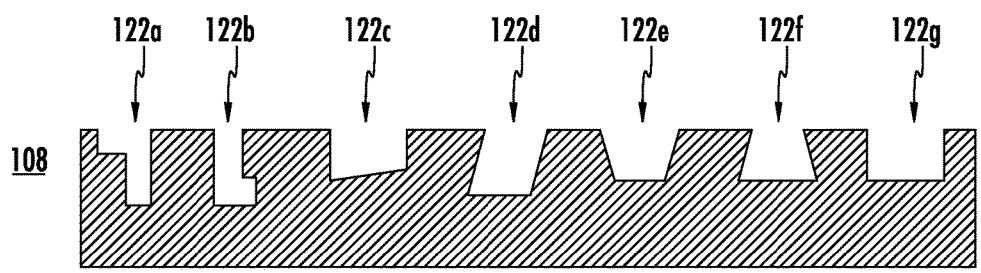
FIG. 1B are cross-sectional views of embodiments of recesses.

The recess(es) 122 serve also to interlock, and thus mechanically secure, the encapsulation 110 with the MIS 104, thus enhancing the reliability of the encapsulated component 100. Exemplary recess profiles are illustrated in FIG. 1B, and include an inverted L shape recess 122a, L shape recess 122b, quadrilateral shape recess 122c, parallelogram shape recess 122d, inverted trapezoid shape recess 122e, trapezoid shape recess 122f, and a rectangular shape recess 122g. Shapes such as the L shape recess 122b, quadrilateral shape recess 122c, and trapezoid shape recess 122f enhance, due to their shape, the interlocking strength, e.g. between the encapsulation 110 and the molded insulator carrier 108.

The dimensions of a recess 122 are dependent upon the technique used to form the recess, the dimensions of the insulators, the dimensions necessary to maintain the structural integrity of the MIS 104, the dimensions needed to facilitate venting, and the number of recesses 122 required to enhance adhesion between the two insulators. In one embodiment, the height of the recess 122 is greater than or equal to fifty percent of height of the insulator in which the recess 122 is formed, e.g. greater than thirty-seven and one half microns. In another embodiment, the width of the recess 122 is greater than or equal to thirty-three percent of the width of an adjacent MIS 104 terminal and/or interconnect, e.g. greater than fifteen microns. In yet another embodiment, the ratio of the width of the recess 122 to the height of the recess 122 is between forty and one hundred percent.

Returning to FIG. 1A, the MIS 104 may also include one or more terminal(s). In another embodiment, the molded insulator carrier 108 may also include one or more interconnect(s) (subsequently described). FIG. 1A illustrates an MIS 104 including a first terminal 112 and a second terminal 114. In another embodiment, the exposed surfaces of the first terminal 112 and second terminal 114 are respectively, substantially coplanar with the top surface 132 and bottom surface 134 of the molded insulator carrier 108. In yet another embodiment, the top side 132 of the molded insulator carrier 108 is the side adjacent to the device 102, and the bottom side of the molded insulator carrier 108 is the side that is configured to be adjacent to the mounting structure. The device 102 is electrically and mechanically coupled to the MIS 104 with a conductive adhesive material, e.g. solder, between MIS terminals and device terminals.

Figure 2:
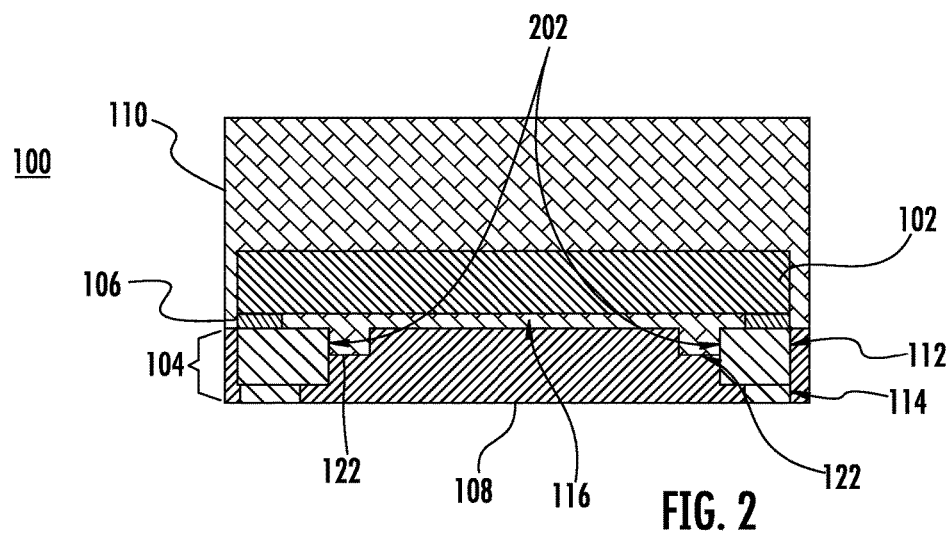
FIG. 2 is a cross-sectional view of another embodiment of an encapsulated component including a molded insulator carrier with recesses.

In one embodiment, illustrated in FIG. 2, one or more recess(es) 122 can be made in the molded insulator carrier 108 where at least one sidewall 202 is formed by a terminal 112. In yet another embodiment, the recess(es) 122 can be formed in part or wholly in a terminal.

Returning to FIG. 1A, when the encapsulated component 100 is mounted onto a mounting structure 150, such as a PCB, heat is typically applied to melt a conductive adhesive material 106, e.g. solder, to mechanically and electrically couple the encapsulated component 100 to the mounting structure 150. As the temperature of the encapsulated component 100 increases, so may the hydrostatic pressure of the conductive adhesive material 106 (attaching a device 102 to the MIS 104) adjacent to the encapsulation 110. This hydrostatic pressure increase enhances the risk that the encapsulation 110 will delaminate from the MIS 104 and/or crack. Delamination and cracking undesirably diminish the reliability of the encapsulated component 100.

Figure 3:
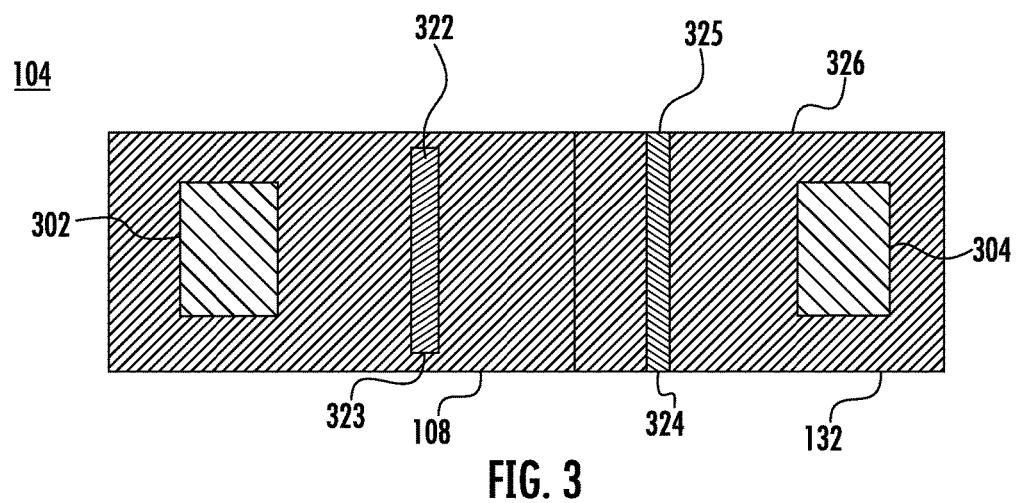
FIG. 3 is a top down view of an embodiment of a molded interconnect substrate with recesses.

FIG. 3 is a top down view of one embodiment of the MIS 104 illustrated in FIG. 1. In this embodiment, a first terminal 302 and second terminal 304 are exposed through, and are substantially coplanar to, the top surface 132 of the molded insulator carrier 108. In another embodiment, as illustrated in FIG. 1A, one or more terminals could be exposed through, and substantially coplanar, on the bottom surface 134 of the molded insulator carrier 108. FIG. 3 also illustrates two recesses. FIG. 3 illustrates a first recess 322 with a first end 323 within the molded insulator carrier 108. FIG. 3 also illustrates a second recess 324 with a second end 325 exposed to the exterior of the MIS 104, and coplanar with an exposed side 326 of the molded insulator carrier 108.

In one embodiment, two or more recesses can be formed skewed with respect to one another. In another embodiment, one or more sets of one or more recesses in an MIS 104 may form one or more closed plane shape on the top surface 132, as illustrated, for example, in FIGS. 4A and 4B; closed plane shapes includes circles, ellipses, triangles, quadrilaterals, regular polygons, and irregular polygons. Each set of recesses may be formed skewed with respect to one another.

Figure 4A:
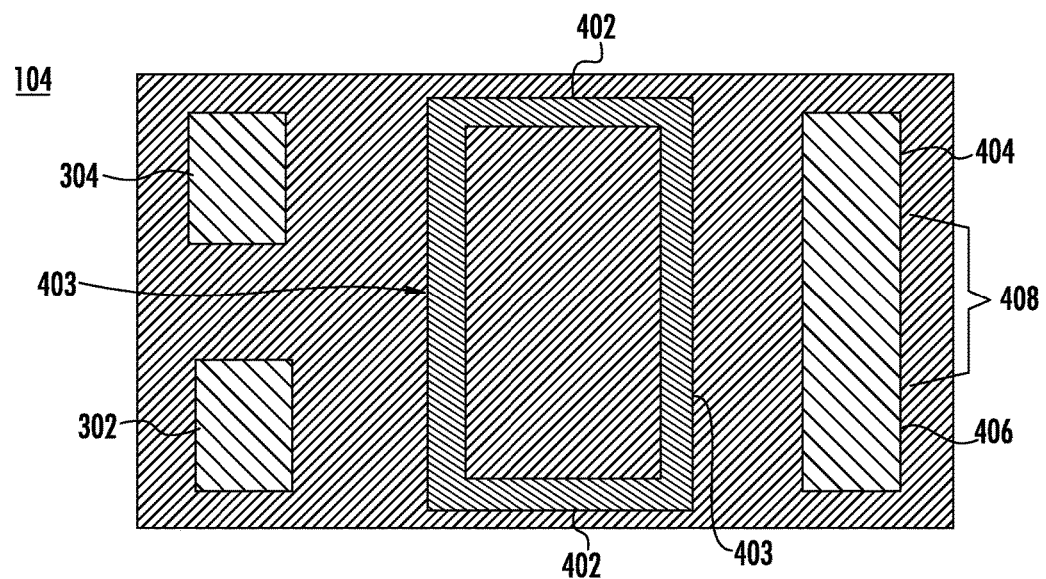
FIG. 4A is a cross-section of another embodiment of a molded interconnect substrate with recesses.
Figure 4B:
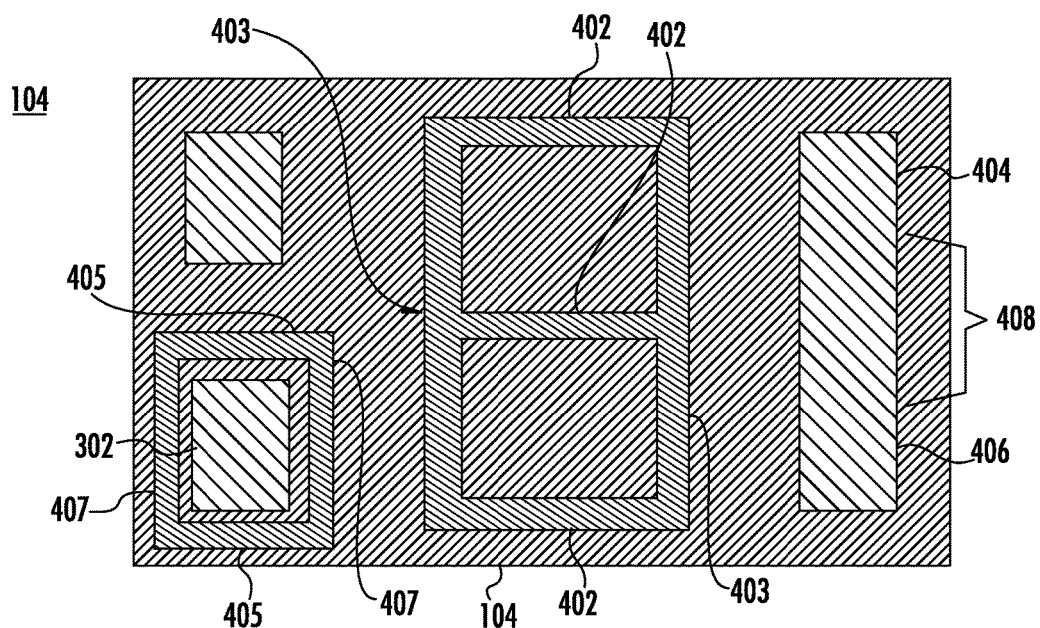
FIG. 4B is a cross-section of yet another embodiment of a molded interconnect substrate with recesses.

FIG. 4A illustrates one embodiment of a closed plane shape, i.e. a rectangle, implemented by a first pair of recesses 402 and a second pair of recesses 403. The first pair of recesses 402 are perpendicular to the second pair of recesses 403. FIG. 4B illustrates another embodiment of a closed plane figure, i.e. a rectangle formed by a first pair of recesses 405 perpendicular to a second set of recesses 407 that surrounds the first terminal 302. FIG. 4B illustrates yet another embodiment of close plane figures, i.e. two adjacent rectangles formed by a first set of recesses 402 skewed, i.e. perpendicular, with a second set of recesses 403.

Figure 4C:
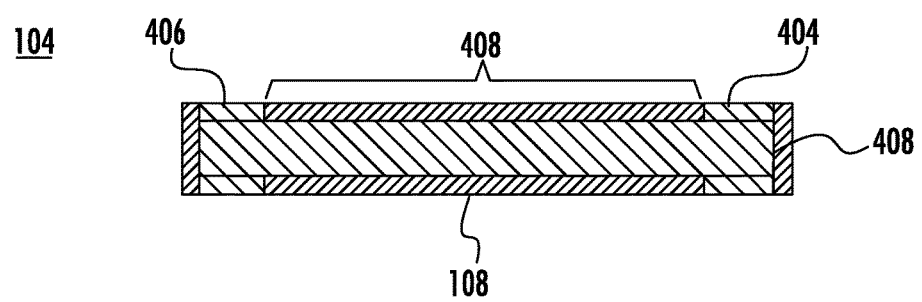
FIG. 4C is a cross-section of an embodiment of a molded interconnect substrate including a conductive interconnect.

Returning to FIG. 4A, in another embodiment, a conductive interconnect 408 may connect a first terminal 404 to a second terminal 406. FIG. 4C illustrates a cross-section of an MIS 104 and a conductive interconnect 408 therein, connecting the first terminal 404 to the second terminal 406.

Figure 5A:
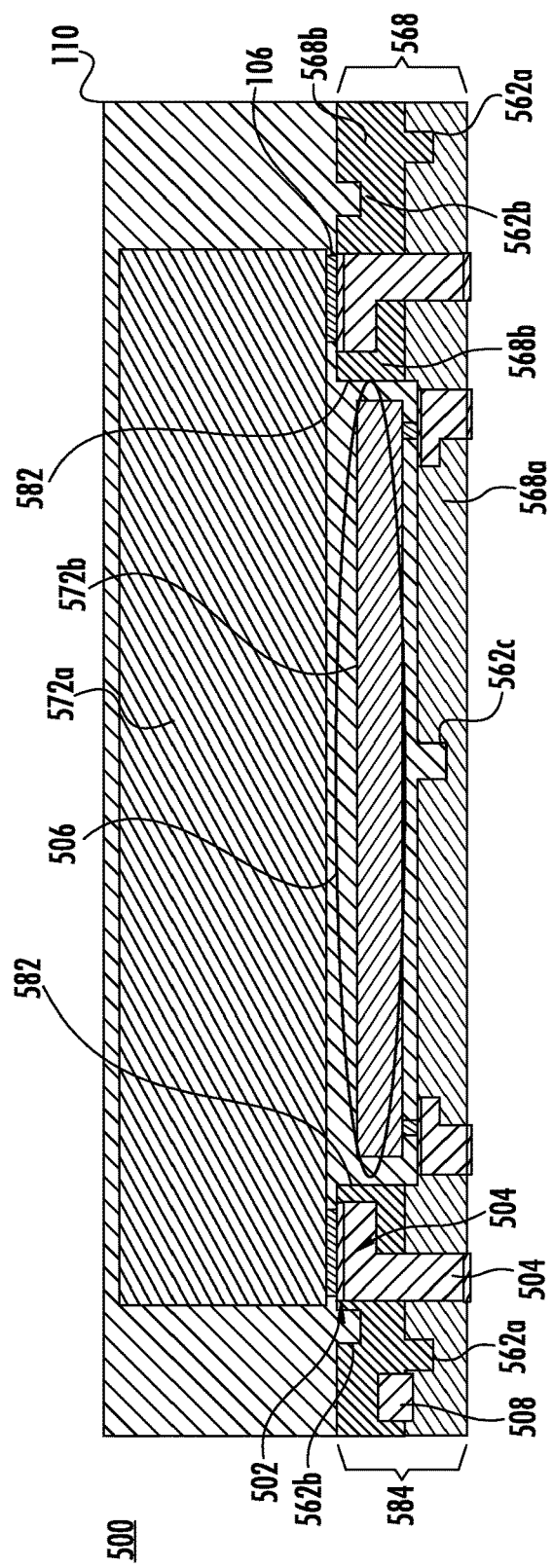
FIG. 5A is a cross-sectional view of another embodiment of an encapsulated component including a molded insulator carrier with recesses.

An MIS's molded insulator carrier may include one or more layers of insulator. FIG. 5A illustrates another embodiment of an encapsulated component 500. This embodiment includes an MIS 584 with a molded insulator carrier 568 having a bottom insulator 568a and a top insulator 568b. This embodiment also includes a first device 572a and a second device 572b. The second device 572b is in a device recess 506 in the top insulator 568b where the top insulator 568b has been removed. The sides 582 of the device recess 506 are formed by the top insulator 586b. The bottom of the recess of the device recess is formed by the bottom insulator 568a.

Additional insulator layer(s) facilitate construction of more complex encapsulated components with two or more devices and/or more conductive interconnects. In one embodiment, similar to multilayer PCBs, the MIS can include additional insulator and conductor layers used to form complex pattern, multilevel conductive interconnects.

Figure 5B:
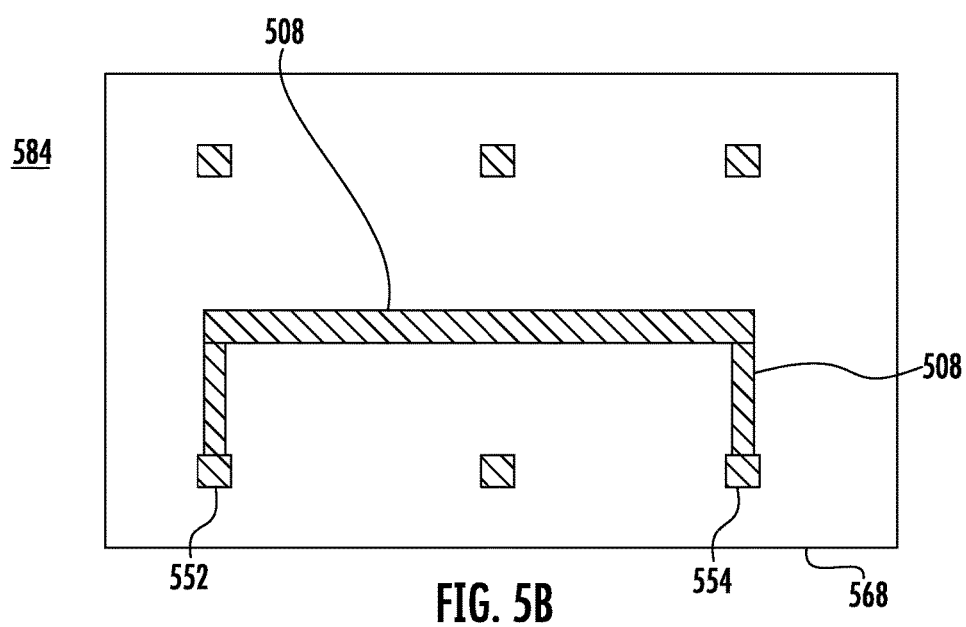
FIG. 5B is a cross-section of one embodiment of a molded insulator substrate with interconnected terminals.

In one embodiment, a conductive interconnect 508 may be formed by a conductor above the bottom insulator 568a and in the top insulator 568b. The conductive interconnect 508 permits connections between adjacent and non-adjacent terminals in the molded insulator substrate 584. FIG. 5B illustrates a cross-section of an exemplary MIS 584 having a molded insulator carrier 568, a first terminal 552 and a second terminal 554, that are electrically coupled by a conductive interconnect 508. The shape, length, width and thickness of terminals and interconnects may vary based upon the MIS 584 design requirements, and the manufacturing process used to make the MIS's 584.

Referring back to FIG. 5A, the exemplary molded insulator carrier 568 has one or more recesses 562a in a bottom insulator 568a configured to vent the top insulator 568b formed above the bottom insulator 568a. When the top insulator 568b is formed in such recess(es) 562a, the two insulators become mechanically interlocked, enhancing adhesion between the two insulators.

In one embodiment, the top insulator 568b may have one or more recesses 562b configured to vent the encapsulation (otherwise herein as the second insulator) 110 when the second insulator 110 is formed over the top insulator 568b. In another embodiment, the bottom insulator 568a may have one or more recesses 562c configured to vent the second insulator 110 when the second insulator 110 is formed over the bottom insulator 568a; this occurs, e.g. when the component is encapsulated by the second insulator 110 to form the encapsulated component 500. When the second insulator 110 is formed in the recess(es) 562b, 562c of the top insulator 568b and/or the bottom insulator 568a, the second insulator 110 becomes become mechanically interlocked with the other insulator(s), enhancing adhesion between second insulator 110 and the other insulator(s).

FIG. 5A also illustrates one embodiment of an MIS 584 having a contact metal 502 on each terminal 504. The contact metal 502 improves the electrical and mechanical connection between a terminal 504 and corresponding conductive adhesive material 106. The contact metal 502 may be formed, e.g. by depositing metal on the terminals 504 using photolithographic patterning and plating. In other embodiments, two or more layers of contact metal 502 may be formed above a terminal.

In one embodiment, if the encapsulated component 500 includes two or more devices 572*a*, 572*b* that are IC(s), transistor(s), or other active semiconductor device(s), then the encapsulated component may be referred to as a multichip module. FIG. 5A illustrates an exemplary multichip module.

A multichip module for example, may be used to implement all or part of a DC-DC voltage converter (e.g. buck converter, a boost converter, a buck-boost converter, or a synchronous buck converter). For example, the multichip module would include two active devices; the first device 572*a* may be a Pulse Width Modulation (PWM) controller and driver Integrated Circuit (IC) (which is described below), and the second device 572*b* may be an IC incorporating the upper MOSFET and lower MOSFET (which are described below). In another embodiment, the multichip module would include a third (passive) device that is output filter (which is described). Each of the PWM controller and driver IC, IC with upper and lower MOSFETs, and output filter would have one or more device terminals. In one embodiment, at least one device terminal of each device would be electrically coupled to a unique terminal of the MIS 104.

Figure 6:
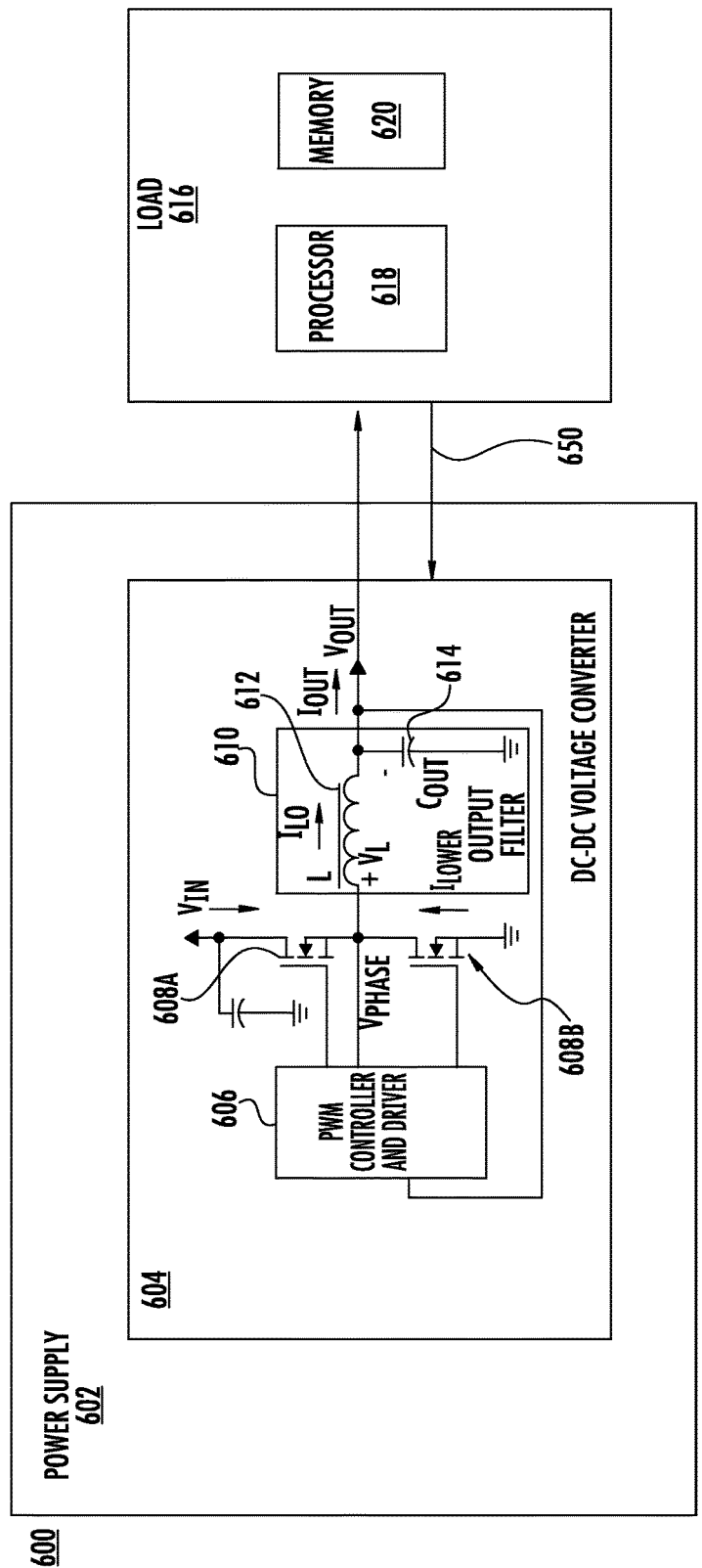
FIG. 6 is one embodiment of an electrical system.

FIG. 6 illustrates an exemplary electrical system 600 in which a load 616 (e.g. a processing system), is coupled to a power supply 602 that includes a DC-DC voltage converter 604. The output of the DC-DC voltage converter 604 supplies DC power to the load 616. In one embodiment, the processing system may include a processor 618 and memory 620 which are coupled to one another. The processor 618 can be electrically coupled to, communicate with, and/or control the voltage converter through a data bus 650. The output of the DC-DC voltage converter 604 is coupled to the processor 618.

In one embodiment, the DC-DC voltage converter 604 includes a pulse width modulation ('PWM') controller and driver 606, power transistors, e.g. upper metal oxide semiconductor field effect transistor ('MOSFET') 608A and a lower MOSFET 608B, and output filter 610. In one embodiment, the output filter 610 may include a series inductor 612 and a shunt capacitor 614. In one embodiment, the PWM controller and driver 606 are fabricated on the same IC. Alternatively, the PWM controller and driver 606 may be fabricated on separate ICs. In yet another embodiment, the transistors 608 may be fabricated on the same IC as the PWM controller and driver 606, or alternatively on the same IC as the driver.

In other examples, an encapsulated component would include one or more components of other power management systems including all or part of a charger, a hot-swap controller, an AC-DC converter, or a bridge driver.

Various examples of methods of manufacturing the previously described MIS and encapsulated component will now be illustrated. Manufacturing an MIS or encapsulated component may be undertaken when contemporaneously manufacturing a plurality of respectively MISs or encapsulated components. Accordingly, a plurality of encapsulated components or MISs can be assembled adjacent to one another. Once assembled, the encapsulated components or MISs can be singulated. Singulation can occur prior to or after forming the MIS. Singulation can also occur after forming the encapsulated components. Thus, the following description refers to the process of forming a single encapsulated component or MIS, but it should be understood that the process could involve contemporaneously forming a plurality of encapsulated components or MISs.

Exemplary methods of manufacture will now be described. In one embodiment, one or more recesses are formed using sacrificial protrusion(s), or protrusions, that are subsequently removed to form recesses. In another embodiment, one or more recesses are formed by removing a portion of an insulator or portion of the conductive interconnect.

Figure 7:
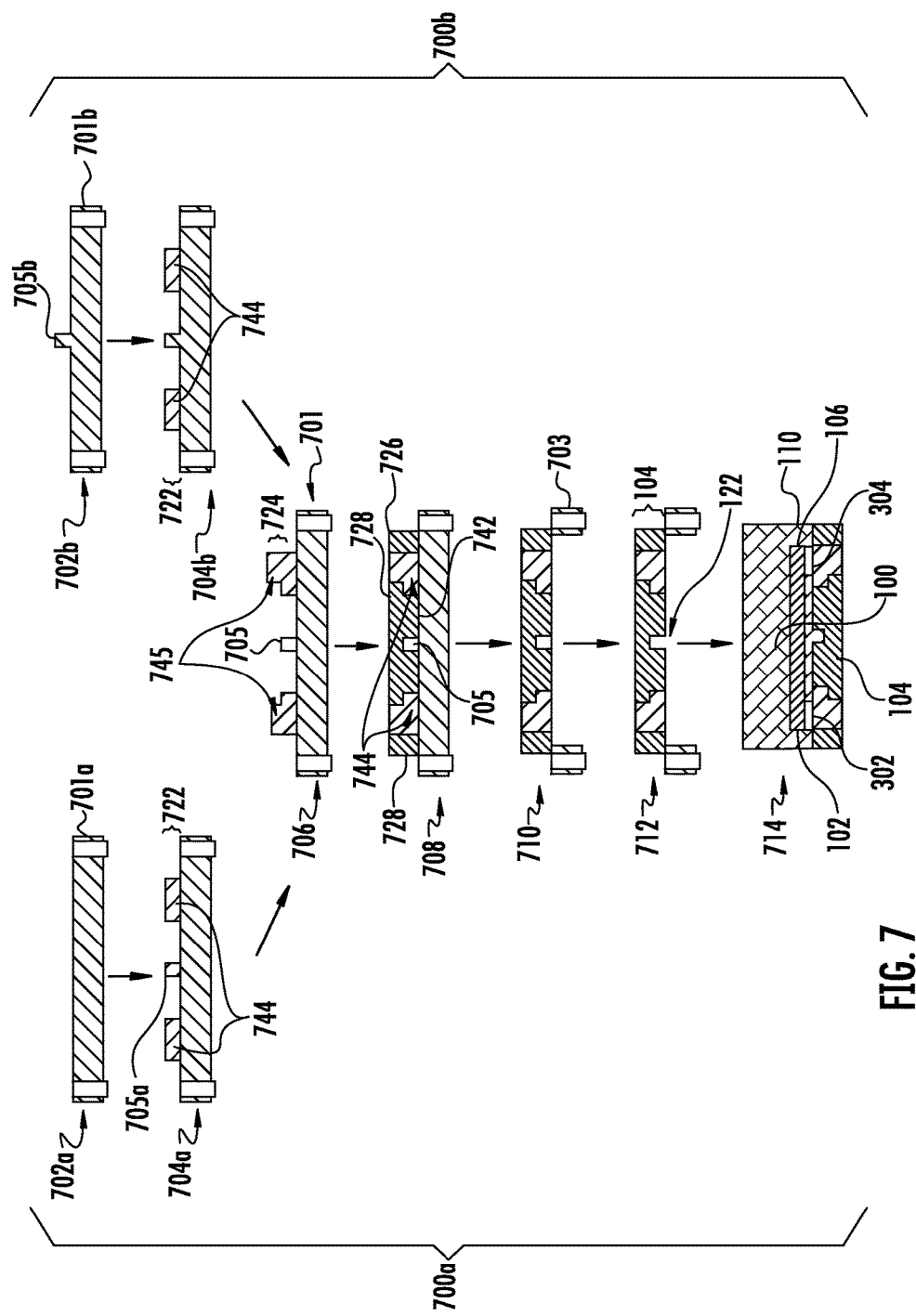
FIG. 7 illustrates two exemplary methods of manufacturing an encapsulated component including a molded insulator substrate including one or more recesses.

FIG. 7 illustrates two exemplary methods of manufacturing an encapsulated component 100, including a MIS 104, by which recesses are formed using protrusion(s). In the first exemplary method 700*a*, a sacrificial carrier 701*a* is formed at block 702*a*. The sacrificial carrier 701*a* may be made, by molding or stamping, from a metal such as aluminum.

Figure 8:
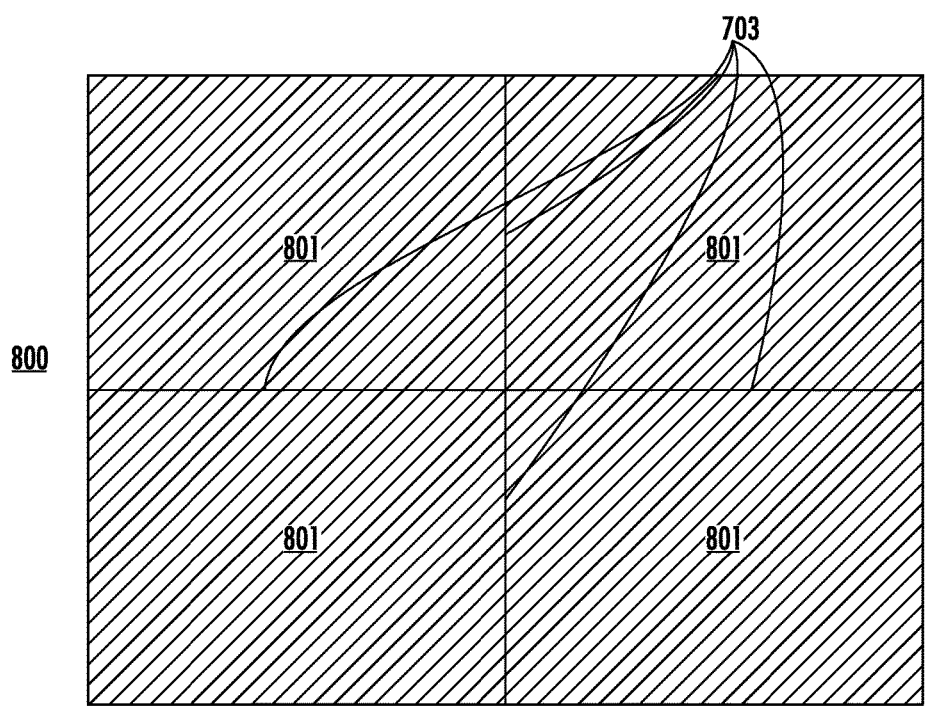
FIG. 8 is one embodiment of a sacrificial carrier array.

An array of sacrificial carriers 701*a* may be formed contemporaneously. In one example, sacrificial carriers 701*a*, in the array, are coupled by kerfs 703; this array permits more than one MIS 104 and/or encapsulated component 100 to be manufactured simultaneously. FIG. 8 illustrates one embodiment of a sacrificial carrier array 800 formed by four sacrificial carriers 801 that are coupled (and separated) by four kerfs 703.

Returning to FIG. 7, at block 704*a*, one or more protrusions 705*a*, a set of one or more pairs of terminals 744 and zero or more conductive interconnects are formed by depositing, e.g. by photolithographic patterning and plating, a first conductor 722 on the sacrificial carrier 701*a*. In one embodiment, the first conductor 722 is first deposited on the sacrificial carrier 701*a*, and then patterned using photolithography; exposed undesired portion(s) are then removed. Alternatively, the patterning could be accomplished first, and the first conductor 722 deposited or grown, e.g. by plating, in exposed region(s) on the surface of the sacrificial carrier 701*a* that are exposed by photolithography.

In the second exemplary method 700*b*, a sacrificial carrier 701*b* with a protrusion 705*b* is formed at block 702*b*. In one embodiment, the protrusion 705*b* may be formed when making the sacrificial carrier 701*b*, e.g. when the sacrificial carrier 701*b* is made by stamping or molding. The method 700*b* at block 704*b* is similar to method 700*a* at block 704*a* except that a set of one or more pairs of terminals 744 and zero or more conductive interconnect(s) are formed at block 704*a*; no protrusion is formed during block 704*b*. However, in another embodiment, one or more protrusions 705*a* could be formed on a sacrificial carrier 701 by 700*a*, and one or more protrusions 705*b* could be formed on the same sacrificial carrier 701 by method 700*b*.

Methods 700*a* and 700*b* may include optional block 706. In an optional block 706, a second conductor 724, is formed and patterned above and possibly adjacent to the first conductor 722, e.g. on top of and connecting to the first conductor 722. The second conductor 724 may be formed by using the photolithographic techniques described above. Thus, a second set of one or more pairs of terminals 745 is formed on top of and connecting to the set of one or more pairs of terminals 744.

Block 708 is used for both exemplary methods 700*a* and 700*b*. In block 708, a first insulator 728 is formed over the sacrificial carrier 701b, around the set of one or more terminals 744 (and the second set of one or more terminals 745 if any), and over the protrusion 705; at this block the molded insulator carrier (e.g. the one or more protrusions 705 and the kerf 703 still need to be removed) is substantially formed. The first insulator 728 has a first side 742 adjacent to the sacrificial carrier 701b, and an opposite second side 726, e.g. which is exposed. In one embodiment, the first insulator 728 can be plastic (e.g. thermoset material, such as EMC, or thermoplastic material) which is injected into a mold and later cured. In one embodiment, after the first insulator 728 is formed, the exposed opposite surface 726 of the first insulator 728 and any exposed conductor is mechanically ground to ensure that the terminals are exposed. Such grinding can occur after partial or full curing. Curing can be performed before or after singulation.

However, in another embodiment, blocks 704a, 704b may be interchanged with block 708 respectively in methods 700a and 700b. That is, a first insulator 728 may first be deposited and patterned on the sacrificial carrier 701a, 701b (forming a molded insulator carrier). The first conductor 722 would then be deposited or grown on exposed surfaces of the sacrificial carrier 701a, 701b.

In block 710, the sacrificial carrier 701 is either completely removed, or substantially removed leaving only the kerf 703; such removal exposes the first surface of the first insulator. In one embodiment, the sacrificial carrier 701 may be removed by photolithographic patterning and chemically etching the sacrificial carrier 701.

In block 712, the recess(es) 122 are formed by removing the protrusion(s) 705 in the first insulator 728, e.g., by photolithographic patterning and chemically etching the first insulator 728. In one embodiment, this substantially completes formation of the MIS 104 (except that any kerfs need be removed as described above). In another embodiment, subsequent to protrusion 705 removal, the MISs 104 may be singulated. In yet another embodiment, after protrusion 705 removal, the MIS 104 mold compound may be cured. In yet a further embodiment, prior or subsequent to protrusion 705 removal, the exposed one or more terminals may be plated with one or more conductors as described above.

In block 714, an encapsulated component 100 is formed with the MIS 104. One or more device(s) 102 are mounted onto the MIS 104. In one embodiment, the device terminal(s) are coupled to corresponding MIS terminal. In another embodiment, one or more device(s) 102 may be attached to the MIS 104 by connecting device terminal(s) and MIS terminal(s) with a conductive adhesive material (as is further described herein). As also described herein, encapsulation (or a second insulator as described herein) 110 is then formed over the one or more device(s) 102 and MIS 104. In one embodiment, the encapsulation 110 fills or substantially fills the recess(es) 122.

In one embodiment, prior to device mounting, conductive adhesive material 106 is first deposited on one or more (plated or un-plated) MIS terminals, e.g. terminals. These one or more terminals are on the same surface of the MIS 104 in which the one or more recess(es) 122 are formed. The device(s) 102 are mounted onto the MIS 104 such that one or more terminals (e.g. leads or bond pads) of the device(s) 102 contact conductive adhesive material 106 on the corresponding one or more MIS terminals. In one embodiment, at this block 714 or in a subsequent block, the MIS 104 must be heated and cooled so that the conductive adhesive material 106 mechanically and electrically connects the terminal(s) of the one or more device(s) 102 and the MIS 104.

In one embodiment, the kerf 703 is removed during block 714 (after the encapsulation 110 is formed), e.g. by sawing, stamping or etching; this facilitates singulating an array of encapsulated components 100.

Figure 9:
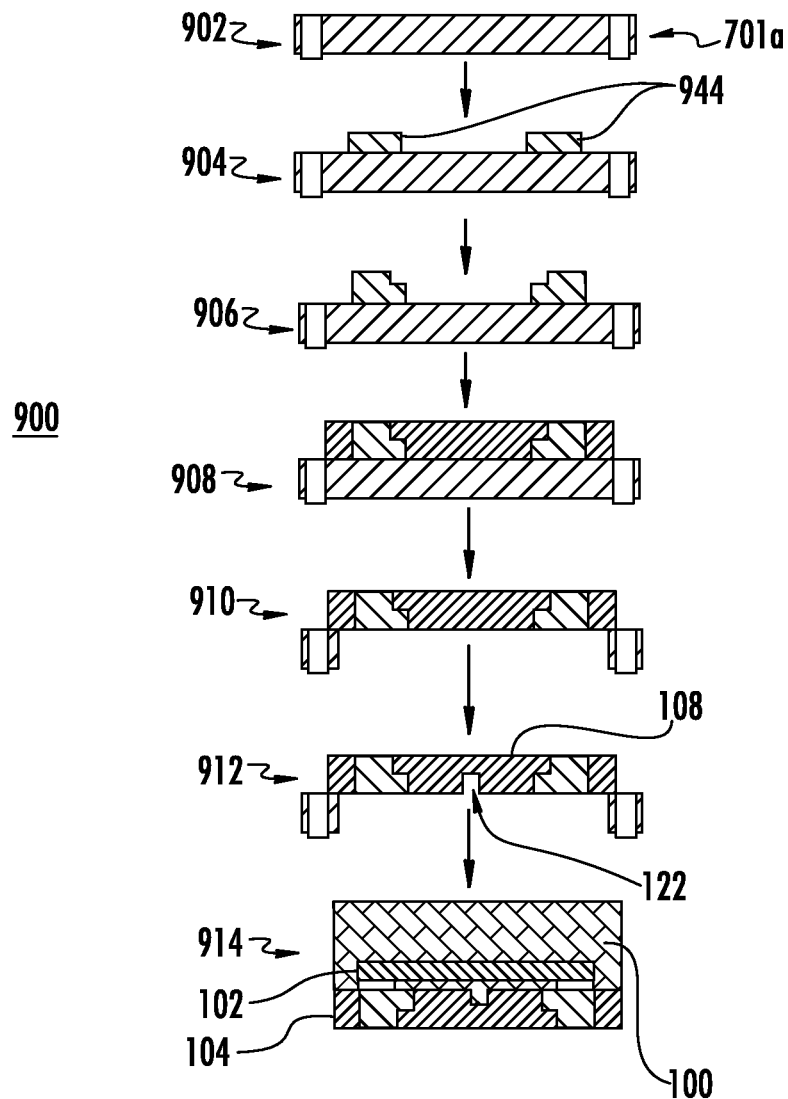
FIG. 9 is another exemplary method of manufacturing an encapsulated component including a molded insulator substrate including one or more recesses.

FIG. 9 illustrates another method 900 of fabricating an encapsulated component 100 including a MIS 104 with one or more recesses. Unlike the two exemplary methods 700a, 700b described above, no protrusion(s) 705 are formed using this method 900. In block 902, a sacrificial carrier 701a is formed. The sacrificial carrier 701a is formed in as described above for method 700. Also, as described above, an array of sacrificial carriers 701a may be formed contemporaneously.

In block 904, one or more terminals 944 and zero or more conductive interconnects are formed, e.g. as described above for methods 700a, 700b; however, no protrusions are formed. Successive blocks 908, 910, and 914 are performed as described above for methods 700a, 700b. Blocks 904 and 908 may be interchanged as described above for methods 700a, 700b. Optional block 906 may also be performed as described above for methods 700a, 700b.

Block 912 is performed by removing one or more portion(s) of the molded insulator carrier 108 to create one or more recess(es) 122. In one embodiment, this substantially completes formation of the MIS 104 (except that any kerfs need be removed as described above). Such portion removal may be performed by chemical etching, laser ablation, or mechanical removal such as by a saw; in one embodiment, the one or more portion(s) to be removed are defined by photolithography.

Figure 10:
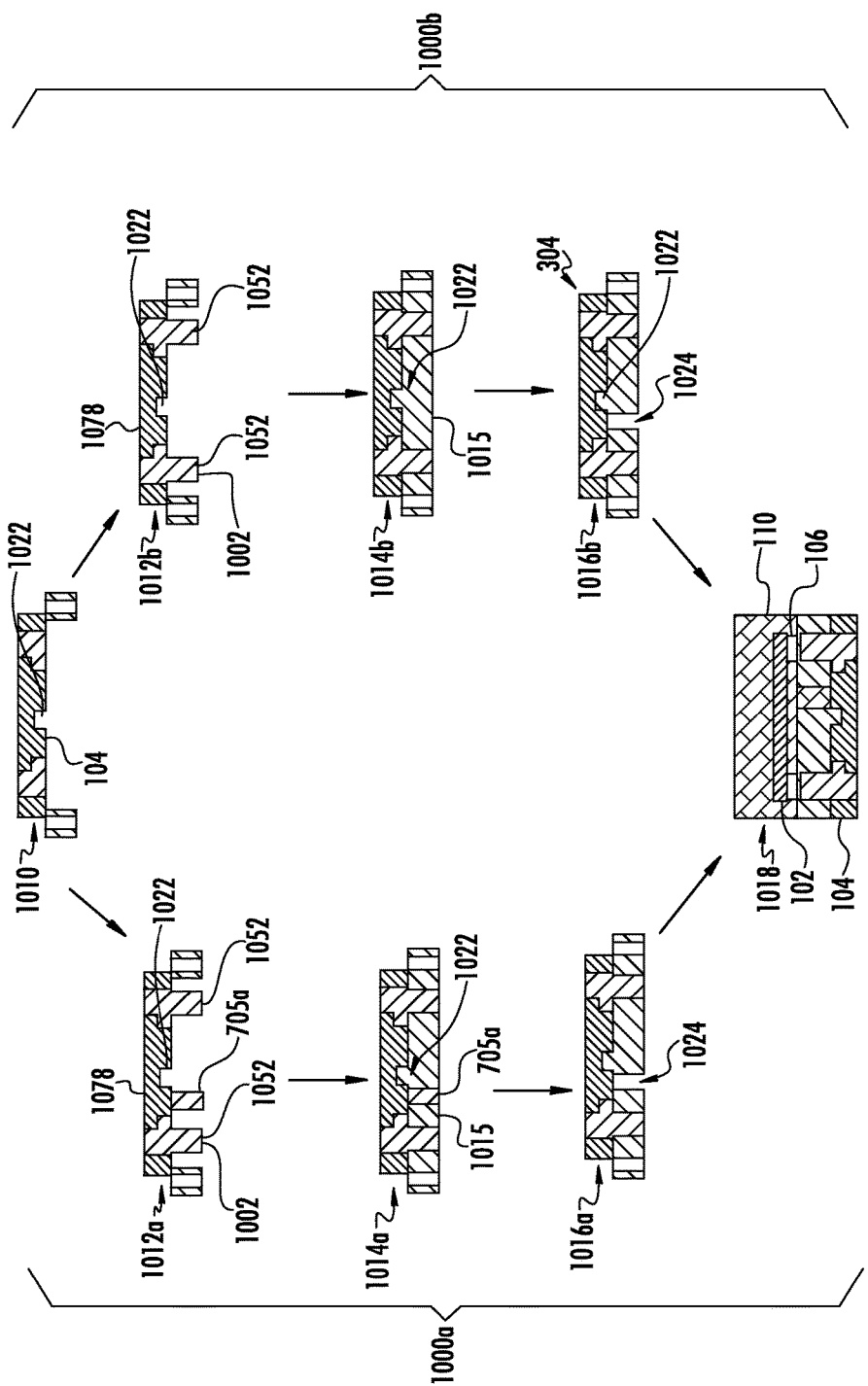
FIG. 10 illustrates two exemplary methods of manufacturing an encapsulated component including a molded insulator substrate including one or more recesses.

The methods for forming an MIS having two or more insulator layers will now be described. FIG. 10 illustrates two exemplary methods 1000a and 1000b, which are respectively similar to methods 700a, 900. In block 1010 of both methods 1000a and 1000b, an MIS 104 with one or more recesses 1022 is formed by one of the previously described methods 700a, 700b, 900 (except that any kerfs need be removed as described above).

In block 1012a of method 1000a, a third conductor 1002 is deposited and patterned on the partially constructed MIS on top of the exposed conductors and the first insulator 1078. One or more protrusion(s) 705a and a set of one or more pairs of terminal(s) 1052, and zero or more conductive interconnect(s), are formed at this block.

In the event the third conductor 1002 is formed over the first insulator 1078, a method of facilitating third conductor 1002 adhesion to the first insulator 1078 may be required. In one embodiment, a conductive seed layer must first be deposited on the regions of the first insulator 1078, over which the third conductor 1002 is formed. For example, this can entail roughing the corresponding insulator surface(s), and depositing a seed layer of precious metal on such corresponding insulator surface(s).

In yet another embodiment, the first insulator 1078 is an insulator, e.g. a plastic, including a metal-plastic additive. A laser may be used to activate the additive in regions of the first insulator 1078, over which the third conductor 1002 will form.

In block 1014a of method 1000a, a third insulator 1015 is formed on the first insulator 1078 in a manner as described for the formation of the first insulator 728 for methods 700a, 700b. The third insulator 1015 substantially fills the one or more recesses 1022.

In block 1016a of method 1000a, the one or more protrusion(s) 705a are removed as described in methods 700a, 700b forming corresponding recess(es) 1024 in the third insulator 1015.

In block 1018, one or more devices 102 are mounted on the MIS 104 using the methods described in methods 700a, 700b. In one embodiment, one or more device recess(s) 506 are formed in the third insulator, e.g. by photolithography in conjunction with third insulator 1015 deposition or etching. In yet another embodiment, one device 102 is mounted in each device recess 506, e.g., as shown in FIG. 5A, using the methods like those described in 700a, 700b. Second insulator 110 is formed over the device(s) 102 and the MIS 104 as described elsewhere herein; the second insulator 110 substantially fills the one or more recesses 1024 in the third insulator 1015.

When forming a plurality of MISs or encapsulated components at the same time, the plurality can be singulated as described above for methods 700a, 700b.

Method 1000b includes blocks 1010 and 1018 as described above for method 1000a. Block 1014b is the same as block 1014a. Blocks 1012b and 1016b are the same as Blocks 908 (except that a third insulator 1015 is deposited on the first insulator 1078) and 912 (except that the recesses 1024 are in the third insulator 1015).

Terms of relative position as used in this application are defined based on a plane parallel to, or in the case of the term coplanar—the same plane as, the conventional plane or working surface of a MIS, sacrificial carrier, device, encapsulated component, wafer, or substrate, regardless of orientation. The term "horizontal" or "lateral" as used in this application are defined as a plane parallel to the conventional plane or working surface of a MIS, sacrificial carrier, device, encapsulated component, wafer, or substrate, regardless of orientation. The term "vertical" refers to a direction perpendicular to the horizontal. Terms such as "on," "side" (as in "sidewall"), "higher," "lower," "over," "top," and "under" are defined with respect to the conventional plane or working surface being on the top surface of a MIS, sacrificial carrier, device, encapsulated component, wafer, or substrate, regardless of orientation. The term "coplanar" as used in this application is defined as a plane in the same plane as the conventional plane or working surface of a MIS, sacrificial carrier, device, encapsulated component, wafer, or substrate, regardless of orientation.

A number of examples defined by the following claims have been described. Nevertheless, it will be understood that various modifications to the described examples may be made without departing from the spirit and scope of the claimed invention. Features and aspects of particular examples described herein can be combined with or replace features and aspects of other examples. Accordingly, other examples are within the scope of the following claims.

EXAMPLE EMBODIMENTS

Example 1 includes a component, comprising: a first insulator having a first surface and a second surface; a recess in said first surface of the first insulator configured to facilitate venting of a second insulator over exposed regions of the first surface; a first conductive terminal exposed through the first surface; and a second conductive terminal exposed through the second surface and electrically coupled to the first terminal.

Example 2 includes the component of Example 1, further comprising an interconnect coupling the first conductive terminal and the second conductive terminal.

Example 3 includes the component of Example 1, further comprising: a device having a conductive device terminal where the device is mounted over the recess and the conductive device terminal is coupled to the first conductive terminal forming a gap between the device and the first surface.

Example 4 includes the component of Example 3, further comprising: a second insulator encapsulating the device and substantially filling the gap and the recess.

Example 5 includes the component of Example 1, wherein the cross-sectional shape of the at least one recess is rectangular.

Example 6 includes the component of Example 1, wherein the recess forms, wholly or in part, a closed plane shape on the first surface.

Example 7 includes a component, comprising: a first insulator having a first surface and a second surface; a first recess in said first surface of the first insulator; a second insulator, having a third surface and a fourth surface, substantially filling the first recess, and where the third surface is adjacent to the first surface; a second recess in the first surface or the fourth surface configured to facilitate venting of a third insulator over exposed regions of respectively the first surface or fourth surface; a first conductive terminal exposed through the first or fourth surface; and a second conductive terminal exposed through the second surface and electrically coupled to the first terminal.

Example 8 includes the component of Example 7, further comprising a third recess in the first surface configured to facilitate venting of a third insulator over exposed regions of the first surface.

Example 9 includes the component of Example 7, further comprising a third recess in the fourth surface configured to facilitate venting of a third insulator over exposed regions of the fourth surface.

Example 10 includes the component of Example 7, further comprising a conductive interconnect electrically coupling the first conductive terminal and the second conductive terminal.

Example 11 includes the component of Example 7, further comprising: a device having a conductive device terminal where the device is mounted over the second recess and the conductive device terminal is coupled to the first conductive terminal to form a gap between the device and the first surface.

Example 12 includes the component of Example 11, further comprising: a third insulator encapsulating the device and substantially filling the gap and the second recess.

Example 13 includes the component of Example 7, wherein the cross-sectional shape of the first recess and the second recess are rectangular.

Example 14 includes a DC-DC voltage converter, comprising: a molded insulator substrate, comprising: a first insulator having a first surface and a second surface; a recess in said first surface of the first insulator configured to facilitate venting of a second insulator over exposed regions of the first surface; a set of first conductive terminals exposed through the first surface; and a set of second conductive terminals exposed through the second surface and electrically coupled to the set of first conductive terminals; a PWM controller and driver electrically coupled to one or more of the first conductive terminals; at least one power transistor electrically coupled to the PWM controller and driver, and to one or more of the first conductive terminals; a filter electrically coupled to the PWM controller and driver, the at least one power transistor, and one or more of the first conductive terminals; and the second insulator covering the molded insulator substrate, PWM controller and driver, upper MOSFET, lower MOSFET, and filter, and substantially filling the recess.

Example 15 includes the DC-DC voltage converter of Example 14, wherein the PWM controller and driver is over the recess in molded insulator substrate forming a gap that is substantially filled by the second insulator.

Example 16 includes the DC-DC voltage converter of Example 14, further comprising an interconnect coupling one of the set of first conductive terminals to one of the set of second conductive terminals.

Example 17 includes an electrical system, comprising: a power supply; a load electrically coupled to the power supply; and wherein the power supply further comprises: a molded insulator substrate, comprising: a first insulator having a first surface and a second surface; a recess in said first surface of the first insulator configured to facilitate venting of a second insulator over exposed regions of the first surface; a set of first conductive terminals exposed through the first surface; a set of second conductive terminals exposed through the second surface and electrically coupled to the set of first conductive terminals; a PWM controller and driver electrically coupled to one or more of the first conductive terminals; at least one power transistor coupled to the PWM controller and driver, and to one or more of the first conductive terminals; a filter electrically coupled to the PWM controller and driver, the at least one power transistor, and one or more of the first conductive terminals; and the second insulator covering the molded insulator substrate, PWM controller and driver, at least one power transistor, and filter, and substantially filling the recess.

Example 18 includes the electrical system of Example 17, wherein the PWM controller and driver is over the recess in molded insulator substrate forming a gap that is substantially filled by the second insulator.

Example 19 includes the electrical system of Example 17, further comprising an interconnect coupling one of the set of first conductive terminals to one of the set of second conductive terminals.

Example 20 includes the electrical system of Example 17 wherein the load further comprises: a processor; and memory electrically coupled to the processor.

Example 21 includes a method of forming a molded interconnect substrate ('MIS') comprising the steps of: forming at least one sacrificial carrier; forming at least one pair of conductive terminals and at least one protrusion on each sacrificial carrier; forming a first insulator over each carrier, around the one or more terminals of each carrier, and over each protrusion on each sacrificial carrier, where the first insulator has a first surface adjacent to each corresponding sacrificial carrier; removing at least part of each sacrificial carrier exposing the first surface of the first insulator; forming at least one recess in the first surface of the first insulator by removing each corresponding protrusion; and whereby each recess is configured to facilitate venting of a second insulator over exposed regions of the first surface.

Example 22 includes the method of claim 21, further comprising the steps of: mounting at least one device onto the MIS; and forming a second insulator over the at least one device and the MIS where the second insulator substantially fills each recess.

Example 23 includes a method of forming a molded interconnect substrate ('MIS') comprising the steps of: forming at least one sacrificial carrier with at least one protrusion; forming at least one pair of conductive terminals on each sacrificial carrier; forming a first insulator over each carrier, around the one or more terminals of each carrier, and over each protrusion on each sacrificial carrier, where the first insulator has a first surface adjacent to each corresponding sacrificial carrier; removing at least part of each sacrificial carrier exposing the first surface of the first insulator; forming at least one recess in the first surface of the first insulator by removing each corresponding protrusion; and whereby each recess is configured to facilitate venting of a second insulator over exposed regions of the first surface.

Example 24 includes the method of Example 23, further comprising the steps of: mounting at least one device onto the MIS; and forming a second insulator over the at least one device and the MIS where the second insulator substantially fills each recess.

Example 25 includes the method of forming a molded interconnect substrate ('MIS') comprising the steps of: forming at least one sacrificial carrier; forming at least one pair of conductive terminals on each sacrificial carrier; forming a first insulator over each carrier and around the one or more terminals of each carrier, where the first insulator has a first surface adjacent to each corresponding sacrificial carrier; removing at least part of each sacrificial carrier exposing the first surface of the first insulator; forming at least one recess in the first surface of the first insulator by removing at least one portion of the first insulator; and whereby each recess is configured to facilitate venting of a second insulator over exposed regions of the first surface.

Example 26 includes the method of Example 25, further comprising the steps of: mounting at least one device onto the MIS; and forming a second insulator over the devices and the MIS where the second insulator substantially fills the at least one recess.

Example 27 includes the method of claim 25, wherein the removal step is performed by chemical etching.

Example 28 includes the methods of Examples 21, 23 and 25, further comprising: forming at least one pair of second terminals electrically coupled to the at least one pair of terminals; forming at least one second protrusion on the first surface of the first insulator; forming a third insulator over the first surface of the first insulator, around the at least one second protrusion and the at least one pair of second terminals; and forming at least one second recess in an exposed surface of the third insulator by removing the at least one second protrusion; and whereby the at least one second recess is configured to facilitate venting of a second insulator over exposed regions of the exposed surface.

Example 29 includes the methods of Examples 21, 23, and 25, further comprising: forming at least one pair of second terminals electrically coupled to the at least one pair of terminals; forming a third insulator over the first surface of the first insulator, around at least one second protrusion and the at least one pair of second terminals; and forming at least one second recess in an exposed surface of the third insulator by removing at least one portion of the third insulator; and whereby each second recess is configured to facilitate venting of a second insulator over exposed regions of the exposed surface.

Example 30 includes the methods of Examples 28 and 29, further comprising the steps of: mounting at least one device onto the MIS; and forming a second insulator over the devices and the MIS where the second insulator substantially fills each second recess.

The invention claimed is:
1. A component, comprising:
a first insulator having a first surface and a second surface, the first insulator having a width between the first surface and the second surface;

a recess in said first surface of the first insulator configured to facilitate venting of a second insulator over exposed regions of the first surface, the recess having a depth from the first surface that is less than the width;
a first conductive terminal exposed through the first surface; and
a second conductive terminal exposed through the second surface and electrically coupled to the first terminal.

2. The component of claim 1, further comprising an interconnect coupling the first conductive terminal and the second conductive terminal.

3. The component of claim 1, further comprising:
a device having a conductive device terminal where the device is mounted over the recess and the conductive device terminal is coupled to the first conductive terminal forming a gap between the device and the first surface.

4. The component of claim 3, further comprising:
a second insulator encapsulating the device and substantially filling the gap and the recess.

5. The component of claim 1, wherein a cross-sectional shape of the recess is rectangular.

6. The component of claim 1, wherein the recess forms, wholly or in part, a closed plane shape on the first surface.

7. A component, comprising:
a first insulator having a first surface and a second surface;
a first recess in said first surface of the first insulator;
a second insulator, having a third surface and a fourth surface, substantially filling the first recess, and where the third surface is adjacent to the first surface;
a second recess in the first surface or the fourth surface configured to facilitate venting of a third insulator over exposed regions of respectively the first surface or fourth surface;
a first conductive terminal exposed through the first or fourth surface; and
a second conductive terminal exposed through the second surface and electrically coupled to the first terminal.

8. The component of claim 7, further comprising a third recess in the first surface configured to facilitate venting of a third insulator over exposed regions of the first surface.

9. The component of claim 7, further comprising a third recess in the fourth surface configured to facilitate venting of a third insulator over exposed regions of the fourth surface.

10. The component of claim 7, further comprising a conductive interconnect electrically coupling the first conductive terminal and the second conductive terminal.

11. The component of claim 7, further comprising:
a device having a conductive device terminal where the device is mounted over the second recess and the conductive device terminal is coupled to the first conductive terminal to form a gap between the device and the first surface.

12. The component of claim 11, further comprising:
a third insulator encapsulating the device and substantially filling the gap and the second recess.

13. The component of claim 7, wherein a cross-sectional shape of the first recess and the second recess are rectangular.

14. A DC-DC voltage converter, comprising:
a molded insulator substrate, comprising:
a first insulator having a first surface and a second surface;
a recess in said first surface of the first insulator configured to facilitate venting of a second insulator over exposed regions of the first surface;
a set of first conductive terminals exposed through the first surface; and
a set of second conductive terminals exposed through the second surface and electrically coupled to the set of first conductive terminals;
a PWM controller and driver electrically coupled to one or more of the first conductive terminals;
at least one power transistor coupled to the PWM controller and driver, and to one or more of the first conductive terminals;
a filter electrically coupled to the PWM controller and driver, the at least one power transistor, and one or more of the first conductive terminals; and
the second insulator covering the molded insulator substrate, the PWM controller and driver, the at least one power transistor, and the filter, and substantially filling the recess.

15. The DC-DC voltage converter of claim 14, wherein the PWM controller and driver is over the recess in the molded insulator substrate forming a gap that is substantially filled by the second insulator.

16. The DC-DC voltage converter of claim 14, further comprising an interconnect coupling one of the set of first conductive terminals to one of the set of second conductive terminals.

17. An electrical system, comprising:
a power supply;
a load electrically coupled to the power supply; and
wherein the power supply further comprises:
a molded insulator substrate, comprising:
a first insulator having a first surface and a second surface;
a recess in said first surface of the first insulator configured to facilitate venting of a second insulator over exposed regions of the first surface;
a set of first conductive terminals exposed through the first surface;
a set of second conductive terminals exposed through the second surface and electrically coupled to the set of first conductive terminals;
a PWM controller and driver electrically coupled to one or more of the first conductive terminals;
at least one power transistor coupled to the PWM controller and driver, and to one or more of the first conductive terminals;
a filter electrically coupled to the PWM controller and driver, the at least one power transistor, and one or more of the first conductive terminals; and
the second insulator covering the molded insulator substrate, PWM controller and driver, at least one power transistor, and filter, and substantially filling the recess.

18. The electrical system of claim 17, wherein the PWM controller and driver is over the recess in the molded insulator substrate forming a gap that is substantially filled by the second insulator.

19. The electrical system of claim 17, further comprising an interconnect coupling one of the set of first conductive terminals to one of the set of second conductive terminals.

20. The electrical system of claim 17, wherein the load further comprises:
a processor; and
memory electrically coupled to the processor.

* * * * *